US012660131B2

(12) United States Patent
Gebers et al.

(10) Patent No.: US 12,660,131 B2
(45) Date of Patent: Jun. 16, 2026

(54) HEAT DISSIPATING DEVICE AND CONTROLLER ASSEMBLY

(71) Applicant: Robert Bosch GmbH, Stuttgart (DE)

(72) Inventors: Joerg Gebers, Hemmingen (DE);
Andrew Kay, Ludwigsburg (DE);
Georg Sebastian, Marbach A.N. (DE);
Iulian Maga, Ludwigsburg (DE);
Manuel Maul, Keltern (DE); Uwe Zundel, Landsberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 543 days.

(21) Appl. No.: 18/260,587

(22) PCT Filed: Mar. 11, 2022

(86) PCT No.: PCT/EP2022/056346
§ 371 (c)(1),
(2) Date: Jul. 6, 2023

(87) PCT Pub. No.: WO2022/194705
PCT Pub. Date: Sep. 22, 2022

(65) Prior Publication Data
US 2023/0422451 A1 Dec. 28, 2023

(30) Foreign Application Priority Data

Mar. 18, 2021 (DE) ..................... 10 2021 202 654.0

(51) Int. Cl.
*H05K 7/20* (2006.01)
*F28F 13/00* (2006.01)

(52) U.S. Cl.
CPC ........... *H05K 7/2049* (2013.01); *F28F 13/00* (2013.01); *H05K 7/20418* (2013.01); *F28F 2280/02* (2013.01)

(58) Field of Classification Search
CPC ... H05K 7/2049; H05K 7/20418; F28F 13/00; F28F 2280/02
(Continued)

(56) References Cited

U.S. PATENT DOCUMENTS 12,035,510 B2 * 7/2024 Zhou ................... H05K 7/20872
2003/0227750 A1 12/2003 Glovatsky et al.
(Continued)

FOREIGN PATENT DOCUMENTS

DE       19640650 A1    4/1998
DE       10142975 A1    4/2003
(Continued)

OTHER PUBLICATIONS

Translation of JP-2007216823-A (Year: 2007).*
International Search Report for PCT/EP2022/056346, Issued Jul. 4, 2022.

*Primary Examiner* — Mandeep S Buttar
*Assistant Examiner* — Kyle Oxenknecht
(74) *Attorney, Agent, or Firm* — NORTON ROSE FULBRIGHT US LLP

(57) ABSTRACT

A heat dissipating device. The heat dissipating device includes a receiving area open on at least one side, and a mosaic segment, arranged in the receiving area, which includes a thermally conductive and elastic compensation element and a thermally conductive low-adherent contact region. The thermally conductive and elastic compensation element rests against the inner surface of the base of the receiving area. The thermally conductive low-adherent contact region at least partly protrudes out of the receiving area at the open face of the receiving area lying opposite the base. The outer surface of the base of the receiving area forms a rigid first contact surface for a heat source or a heat sink, and the thermally conductive low-adherent contact region of the (Continued)

at least one mosaic segment forms a flexible second contact surface for the heat sink or the source.

15 Claims, 4 Drawing Sheets

(58) Field of Classification Search
USPC .......................................................... 361/704
See application file for complete search history.

(56) References Cited

U.S. PATENT DOCUMENTS

2012/0261108 A1    10/2012    Knauer
2016/0086872 A1     3/2016    Sakita et al.

FOREIGN PATENT DOCUMENTS

| | | | | | |
|---|---|---|---|---|---|
| DE | 10317259 | A1 | | 11/2004 | |
| DE | 102010042537 | A1 | | 4/2012 | |
| DE | 102014202244 | A1 | | 8/2015 | |
| DE | 102019207498 | A1 | | 11/2019 | |
| EP | 1791177 | A1 | | 5/2007 | |
| FR | 3096224 | A1 | | 11/2020 | |
| JP | 2004186294 | A | | 7/2004 | |
| JP | 2007216823 | A | | 8/2007 | |
| JP | 2014063836 | A | | 4/2014 | |
| JP | 2014192479 | A | | 10/2014 | |
| JP | 2015528214 | A | | 9/2015 | |
| KR | 20080027027 | A | * | 3/2008 | ........... H05K 7/2049 |
| TW | M427769 | U | * | 4/2012 | |
| TW | 201307781 | A | * | 2/2013 | |
| WO | 2010006924 | A1 | | 1/2010 | |
| WO | 2016087218 | A1 | | 6/2016 | |

* cited by examiner

HEAT DISSIPATING DEVICE AND CONTROLLER ASSEMBLY

FIELD

The present invention relates to a heat dissipating device, in particular for a controller assembly in a vehicle. In addition, the present invention relates to a controller assembly, in particular for vehicle, with such a heat dissipating device.

BACKGROUND INFORMATION

Various heat dissipation technologies described in the related art for operating electrical assemblies, such as controllers, power output stages, etc., or individual electrical components, such as power semiconductors, microcontrollers, etc., within a specified temperature range. Here, the thermal connection of the components as heat sources to a heat sink, such as a cooling device, has a high influence. In a controller assembly 100 illustrated in FIG. 7 with a controller 3 comprising a housing 4 and at least one heat source 7 arranged within the housing 4, such as an electrical assembly 7A arranged on a printed circuit board 6, and with a heat sink 9 configured as a cooling device 9A, the controller 3 is detachably connected to the cooling device 9A. Here, the at least one heat source 7 is thermally coupled to the housing 4 of the controller 3 via a first thermal interface 8. For example, the first thermal interface 8 may comprise heat conductive materials 8A, also referred to as thermal interface materials (TIM). For example, a so-called gap filler, which preferably consists of a thermally conductive elastomer, can be arranged as TIM 8A between the heat source 7 and a heat dissipating dome 5.1 formed on the base 4 of the housing 4 and form the first thermal interface 8. Since neither an apparently flat surface of the cooling device 9A nor a base 5 of the housing 4 of the controller facing the cooling device 9A in this case are exactly flat, mounting the controller 3 on the cooling device 9A results in an air gap LS, except for the few support points at the corresponding mounting regions, which prevents good heat dissipation due to its low thermal conductivity. As can be seen from FIG. 7, a heat dissipation path WAP of the heat generated by the at least one heat source 7 distributes to a first heat dissipation path WAP1, which dissipates a portion of the heat generated by the heat source to the cooling device 9A via the base 5 of the housing 4 of the controller 3 and the mounting regions. A second heat dissipation path WAP2 dissipates a portion of the heat generated by the at least one heat source 7 as radiant heat and as heat conduction via air molecules across the air gap LS into the cooling device 9A. It is conventional in the related art to use thermally conductive materials, such as thermally conductive pastes or gap fillers, to bridge the air gap LS in order to also achieve better thermal conductivity between the controller 3 and the cooling device 9A. However, such a solution prevents simple replacement of the controller 3, since residues of the heat-conducting material used remain on the cooling device 9A when the controller 3 is dismantled, and these residues must first be removed in a time-consuming manner by cleaning processes. In addition, appropriate thermal conductive materials must be kept on hand during assembly of the replacement controller, and a challenging and difficult to verify bubble-free application must be implemented.

SUMMARY

A heat dissipating device having features of the present invention and the controller assembly having features of present invention each have the advantage that unevenness between a heat source and a heat sink can be compensated. Here, mosaic segments adapt to surface unevenness due to the compressible thermally conductive elastic compensation element. This means that even unevenly joined surfaces can make contact over a large area and thus exhibit good heat transfer. Furthermore, a high robustness against contamination can result, since individual dirt particles in the air gap can only prevent the contact of individual mosaic segments. This still ensures good heat transfer of all other mosaic segments. Spaces between the mosaic segments can serve as "volume buffers". In the case of particles or local unevenness, for example, these spaces can serve as volume compensation for an adhesive medium that holds the mosaic segments in the corresponding receiving area. Improved heat transfer can extend the life of electrical components as heat sources. In addition, less expensive materials with poorer thermal conductivity properties can be used for the housing. Furthermore, more favorable manufacturing processes can be used due to extended tolerance zones. The thermally conductive low-adherent contact regions of the individual mosaic segments allow them to be easily lifted off the corresponding surface of the heat sink or heat source.

Example embodiments of the heat dissipating device according to the present invention allow to compensate for unevenness tolerances to a cooling surface and to absorb a good heat transfer even in case of unevenness of the surfaces and in case of particles between the surfaces, without creating a permanent air gap between the heat source and the cooling device.

Example embodiments of the present invention provide a heat dissipating device, in particular for a controller assembly in a vehicle, having a receiving area open on at least one side and at least one mosaic segment arranged in the receiving area, which comprises a thermally conductive and elastic compensation element and a thermally conductive low-adherent contact region. The at least one mosaic segment is arranged in the receiving area such that the thermally conductive and elastic compensation element of the at least one mosaic segment rests against an inner surface of a base of the receiving area, and at least the thermally conductive low-adherent contact region of the at least one mosaic segment partly protrudes out of the receiving area at an open face of the receiving area which is opposite to the base. Here, an outer surface of the base of the receiving area forms a rigid first contact surface for a heat source or for a heat sink, and the thermally conductive low-adherent contact region of the at least one mosaic segment forms a flexible second contact surface for the heat sink or for the heat source.

In addition, a controller assembly, in particular for a vehicle, having a controller which comprises a housing and at least one heat source arranged inside the housing, and having a heat sink configured as a cooling device, is provided according to the present invention. According to an example embodiment of the present invention, the controller is detachably connected to the cooling device, wherein the at least one heat source is thermally coupled to the housing of the controller via a first thermal interface. At least one heat dissipating device according to the present invention is arranged between the controller and the cooling device, forming a second thermal interface between the housing and the cooling device and dissipating heat generated by the at least one heat source to the cooling device. Here, a direct heat dissipation of the heat generated by the at least one heat source takes place via the first thermal interface, via the housing of the controller, and via the at least one mosaic segment forming the second thermal interface into the cooling device.

Advantageous improvements to the heat dissipating device of the present invention and to the controller assembly of the present invention are possible by the measures and further embodiments disclosed herein.

Particularly advantageously, according an example embodiment of the present invention, the at least one mosaic segment is non-detachably connected to the inner surface of the receiving area. The at least one mosaic segment may be joined to the inner surface of the receiving area by, for example, gluing, welding, soldering, clamping, riveting.

In a particularly advantageous embodiment of the heat dissipating device of the present invention, the at least one mosaic segment may be made of multiple pieces. Here, the thermally conductive and elastic compensation element of the at least one mosaic segment can preferably be configured as a gap filler with a thickness of 1 to 5 mm, for example. The thermally conductive low-adherent contact region of the at least one mosaic segment can preferably be configured as a metal platelet, which can be bonded to the gap filler. The metal platelets of the mosaic segments can be produced, for example, as stamped or laser-cut parts and have, for example, an edge length of between 5 and 20 mm and a thickness in the range of 0.1 to 1.5 mm. Therefore, there is a high geometrical freedom, so that the metal platelets can be easily adapted to the requirements in geometry and material selection and area proportion of the individual mosaic segments on a total cooling surface. The metal platelets can be made, for example, of aluminum, copper, steel, or any other suitable metal. Since the gap filler is largely covered by the individual metal platelets and no adhesion buildup occurs between metals, the thermally conductive low-adherent contact region can be easily removed from a metallic surface of a cooling device or controller housing. For example, for several metal platelets, a gap filler can be bonded over a large area to the inner surface of the receiving area. The individual metal platelets of the mosaic segments can then be bonded with the applied gap filler. This means that several mosaic segments can have a common thermally conductive and elastic compensation element.

In an alternative embodiment of the heat dissipating device of the present invention, the at least one mosaic segment may be made of one piece. Thus, the at least one mosaic segment may comprise at least one spring element forming the thermally conductive and elastic compensation element. Here, a spring end of the at least one spring element can form the thermally conductive low-adherent contact region. The at least one spring element may be made of copper, steel, or another suitable metal, for example, and may be welded or riveted to the inner surface of the receiving area. Since there is no adhesion build-up between the at least one spring element and the metallic surface of the cooling device or the controller housing, the thermally conductive low-adherent contact region can be easily removed again from the corresponding surface.

In a further advantageous embodiment of the heat dissipating device of the present invention, the at least one mosaic segment can be configured as a metal foam part that forms the thermally conductive and elastic compensation element. In this case, a contact surface of the metal foam part facing away from the base of the receiving area can form the thermally conductive low-adherent contact region. For example, the metal foam part may be made of copper or another suitable metal and may be bonded, welded, soldered, or clamped to the inner surface of the receiving area. Alternatively, the at least one mosaic segment can be configured as a metal wool part that forms the thermally conductive and elastic compensation element. In this case, a contact surface of the metal wool part facing away from the base of the receiving area can form the thermally conductive low-adherent contact region. For example, the metal wool member may be made of copper, steel, or another suitable metal and may be bonded, welded, or soldered to the inner surface of the receiving area. Since there is no adhesion buildup between the metal foam part or the metal wool part and the metallic surface of the cooling device or the controller housing, the corresponding thermally conductive low-adherent contact region can be easily removed again from the corresponding surface.

In another alternative embodiment of the heat dissipating device of the present invention, the at least one mosaic segment may be configured as a metal fin structure, also referred to as skived fins, comprising a plurality of fins projecting from a base plate to form the thermally conductive and elastic compensation element. In this case, the base plate can rest against the inner surface of the base of the receiving area and the edges of the fins facing away from the base plate can form the thermally conductive low-adherent contact region. As a further alternative, the at least one mosaic segment may be configured in the form of a metal foil with nubs, which may comprise a plurality of nubs projecting from a base surface to form the thermally conductive and elastic compensation element. In this case, the base of the metal foil with nubs may rest against the inner surface of the base of the receiving area and may be glued or welded to it. The nubs facing away from the base plate can form the thermally conductive low-adherent contact region.

In an advantageous embodiment of the controller assembly of the present invention, the at least one heat dissipating device may comprise a plurality of mosaic segments and may be formed over a large area on the housing of the controller or on the cooling device. This allows, for example, a metallic base surface of a power module to be thermally bonded over a large area to the corresponding surface of the cooling device. For example, the cooling device may have a metal plate with water cooling. Alternatively, several heat dissipating devices can be partially distributed on the housing of the controller or on the cooling device. This allows electrical assemblies located at so-called "hotspots" to be cooled in a targeted manner as heat sources.

In a further advantageous embodiment of the controller assembly of the present invention, the receiving area of the at least one heat dissipating device may be formed in a recess in the region of the first thermal interface of the housing of the controller. Alternatively, the receiving area of the at least one heat dissipating device can be formed in a recess in a surface of the cooling device facing the controller, which surface is arranged in the area of the first thermal interface on the housing of the controller in the assembled state of the controller assembly.

Exemplary embodiments of the present invention are illustrated in the figures and explained in greater detail in the subsequent description. In the figures, identical reference numbers refer to components or elements performing identical or similar functions.

DETAILED DESCRIPTION OF EXAMPLE EMBODIMENTS

Figure 1:
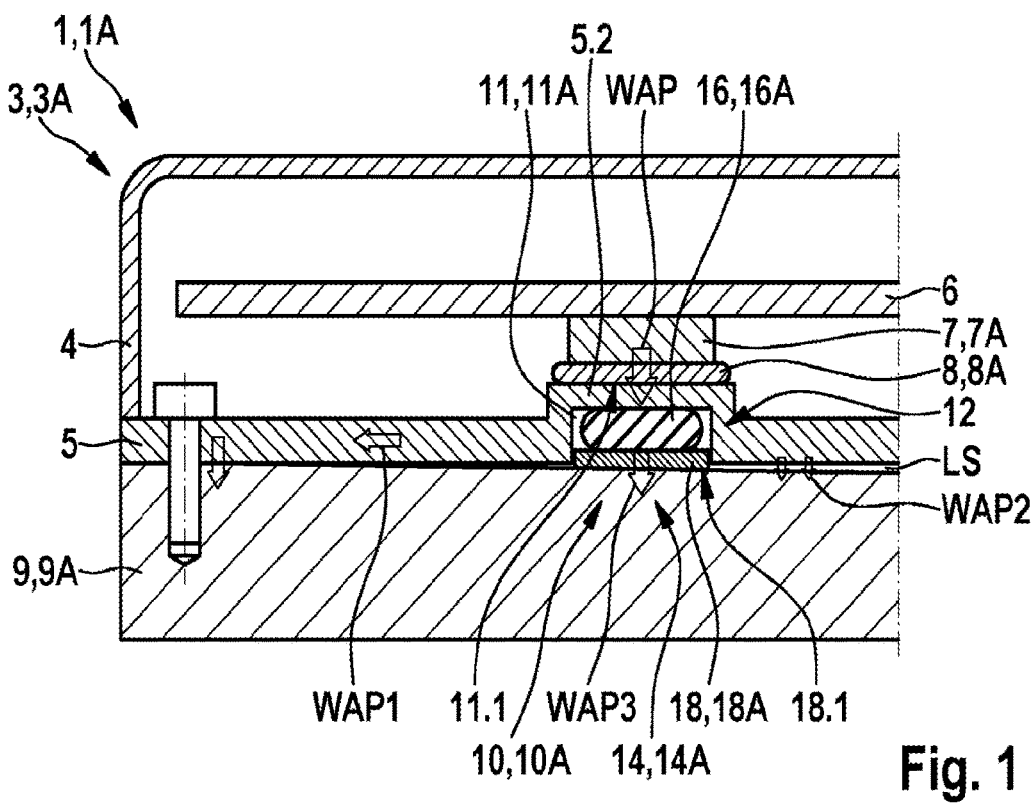
FIG. 1 shows a schematic sectional view of a section of a first exemplary embodiment of a controller assembly according to the present invention, in particular in a vehicle, with a first exemplary embodiment of a heat dissipating device according to the present invention.

As can be seen from FIGS. 1 to 6, the illustrated exemplary embodiments of a controller assembly 1, 1A, 1B, 1C, 1D, 1E according to the present invention, in particular for a vehicle, each comprise a controller 3, 3A, 3B, which comprises a housing 4 and at least one heat source 7 arranged inside the housing 4, and a heat sink 9 configured as a cooling device 9A. The controller 3, 3A, 3B is detachably connected to the cooling device 9A. The at least one heat source 7 is thermally coupled to the housing 4 of the controller 3 via a first thermal interface 8. Furthermore, at least one heat dissipating device 10, 10A, 10B, 10C, 10D, 10E according to the present invention is arranged between the controller 3, 3A, 3B and the cooling device 9A, which forms a second thermal interface 12 between the housing 4 and the cooling device 9A and dissipates heat generated by the at least one heat source 7 to the cooling device 9A. Here, via the at least one heat dissipating device 10, 10A, 10B, 10C, 10D, 10E, the heat generated by the at least one heat source 7 is dissipated directly via the first thermal interface 8, via the housing 4 of the controller 3 and via the second thermal interface 12 into the cooling device 9A.

In the illustrated exemplary embodiments, the cooling device 9A comprises a metal plate having a plurality of channels, not shown, through which water or another suitable coolant is passed to remove heat generated by the at least one heat source 7.

As can be further seen from FIGS. 1 to 6, the illustrated exemplary embodiments of the heat dissipating device 10, 10A, 10B, 10C, 10D, 10E according to the present invention each comprise a receiving area 11, 11A, 11B, 11C open on at least one side, and at least one mosaic segment 14, 14A, 14B, 14C, 14D arranged in the receiving area 11, 11A, 11B, 11C, which comprises a thermally conductive and elastic compensation element 16 and a thermally conductive low-adherent contact region 18. The at least one mosaic segment 14, 14A, 14B, 14C, 14D is arranged in the receiving area 11, 11A, 11B, 11C such that the thermally conductive and elastic compensation element 16 of the at least one mosaic segment 14, 14A, 14B, 14C, 14D rests against an inner surface of a base 11.1 of the receiving area 11, 11A, 11B, 11C, and at least the thermally conductive low-adherent contact region 18 of the at least one mosaic segment 14, 14A, 14B, 14C, 14D partly protrudes out of the receiving area 11, 11A, 11B, 11C at an open face of the receiving area 11, 11A, 11B, 11C, which is opposite to the base 11.1. Here, an outer surface of the base 11.1 of the receiving area 11, 11A, 11B, 11C forms a rigid first contact surface for a heat source 7 or for a heat sink 9, and the thermally conductive low-adherent contact region 18 of the at least one mosaic segment 14, 14A, 14B, 14C, 14D forms a flexible second contact surface for the heat sink 9 or for the heat source 7.

As can be seen further from FIGS. 1 through 6, an electrical assembly 7A, 7B, 7C arranged on a printed circuit board 6, which is configured for example as a power semiconductor, microcontroller, forms the at least one heat source 7. Here, the at least one heat source 7 is thermally coupled to the housing 4 of the controller 3 via a first thermal interface 8. For example, the first thermal interface 8 may comprise heat conductive materials 8A, also referred to as thermal interface materials (TIM). Thus, in the illustrated exemplary embodiment, a so-called gap filler, which preferably consists of a thermally conductive elastomer, is arranged as TIM 8A between the heat source 7 and a recess 5.2 formed on the base 4 of the housing 4 and forms the first thermal interface 8. Here, the receiving area 11, 11A, 11B, 11C of the at least one heat dissipating device 10, 10A, 10B, 10C, 10D, 10E in the illustrated exemplary embodiments is respectively in this recess 5.2 in the base 5 of the housing 4 of the respective controller 3, 3A, 3B.

In alternative exemplary embodiments of the controller assembly 1 not shown, the receiving area 11 of the at least one heat dissipating device 10 is formed in a recess formed in a surface of the cooling device 9A facing the controller 3. Here, the recess is placed on the cooling device 9A in such a way that, in the assembled state of the controller assembly 1, it is arranged in the region of the first thermal interface 8 on the housing 4 of the controller 3.

As can be further seen from FIGS. 1 to 4 and FIG. 6, a heat dissipation path WAP of the heat generated by the at least one heat source 7 distributes to a first heat dissipation path WAP1, which dissipates a portion of the heat generated by the at least one heat source 7 to the cooling device 9A via the base 5 of the housing 4 of the controller 3, 3A, 3B and the mounting regions. A second heat dissipation path WAP2 dissipates a portion of the heat generated by the at least one heat source 7 as radiant heat and as heat conduction via air molecules across the air gap LS into the cooling device 9A. The heat dissipating device 10, 10A, 10B, 10C, 10D, 10E forms a third heat dissipation path WAP3 which dissipates a portion of the heat generated by the at least one heat source 7 directly into the cooling device 9A. In the illustrated exemplary embodiments, the various embodiments of the heat dissipating device 10, 10A, 10B, 10C, 10D, 10E bridge the air gap LS between the controller 3, 3A, 3B and the cooling device 9A to provide better thermal conductivity. Here, the heat dissipating devices 10, 10A, 10B, 10C, 10D, 10E do not leave any residues on the cooling device 9A when the controller 3, 3A, 3B is dismantled, which must first be removed in a time-consuming manner by cleaning processes. In addition, no thermal conductive materials need to be kept on hand during the assembly of the replacement controller.

In the illustrated exemplary embodiments, the individual mosaic segments 14, 14A, 14B, 14C, 14D are non-detachably connected to the inner surface of the respective receiving area 11, 11A, 11B, 11C by a thermally conductive adhesive bond. This means that the thermally conductive and elastic compensation elements 16 are bonded to the respective receiving area 11, 11A, 11B, 11C. Of course, other suitable bonding techniques can be used to non-detachably connect the individual mosaic segments 14, 14A, 14B, 14C, 14D to the inner surface of the respective receiving area 11, 11A, 11B, 11C.

Figure 6:
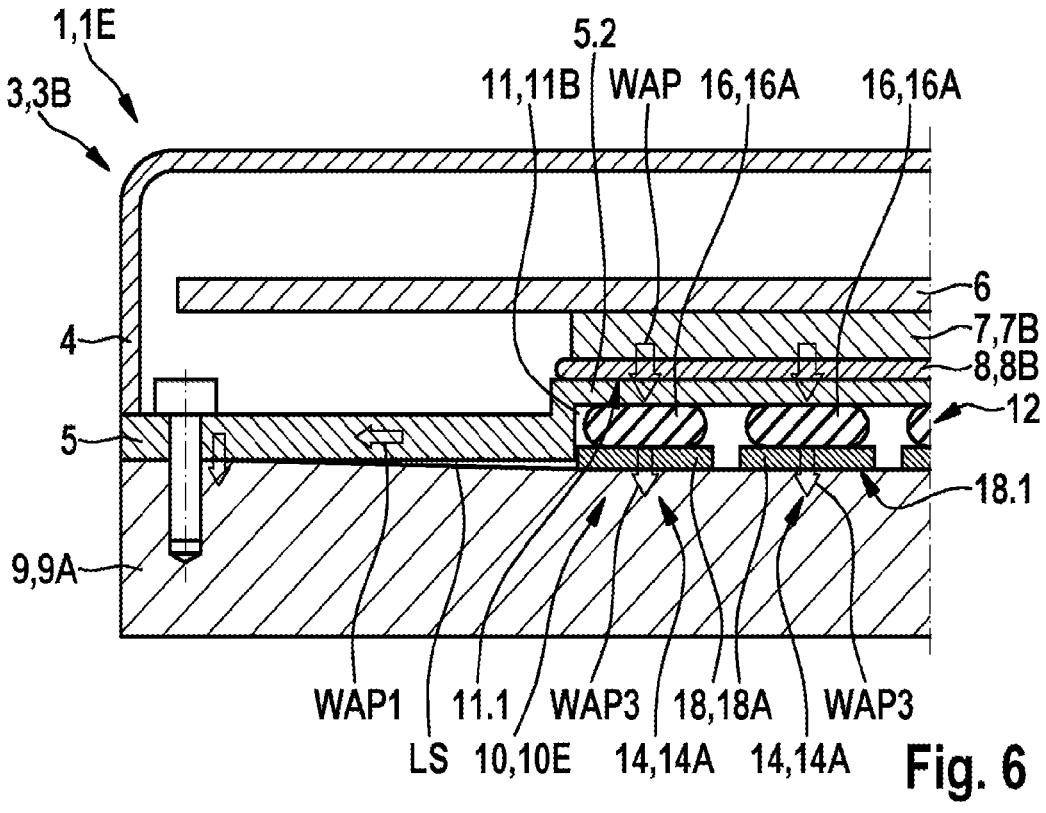
FIG. 6 shows a schematic sectional view of a section of a fifth exemplary embodiment of a controller assembly according to the present invention, in particular in a vehicle, with a fifth exemplary embodiment of a heat dissipating device according to the present invention and the controller of FIG. 5.
Figure 7:
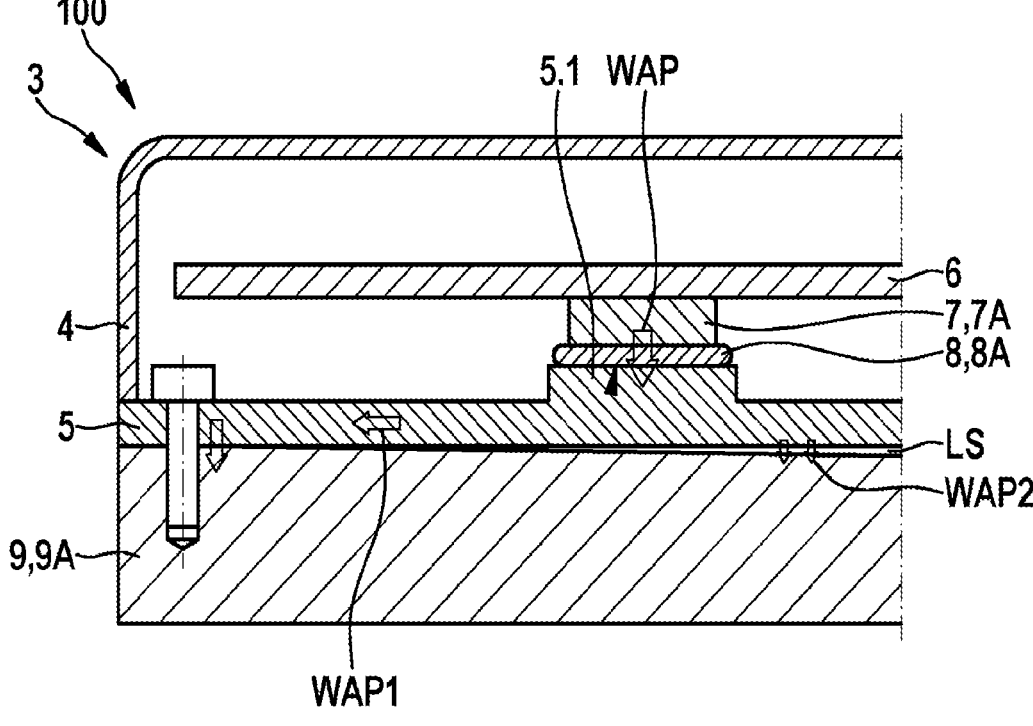
FIG. 7 shows a schematic sectional view of a controller assembly, in particular in a vehicle, without a heat dissipating device according to the present invention.

As can be further seen from FIGS. 1 and 6, the at least one mosaic segment 14A in the illustrated exemplary embodiments of the controller assembly 1A, 1E is made of multiple pieces. Here, the heat dissipating device 10A shown in FIG. 1 has only a single mosaic segment 14A, and the heat dissipating device 10E shown in FIG. 6 has multiple mosaic segments 14A arranged side by side. The thermally conductive and elastic compensation element 16 of the mosaic segments 14A shown is configured as a gap filler 16A in each case. The thermally conductive low-adherent contact region 18 of the illustrated mosaic segments 14A is configured as a metal platelet 18A, which is bonded to the gap filler 16A.

Figure 2:
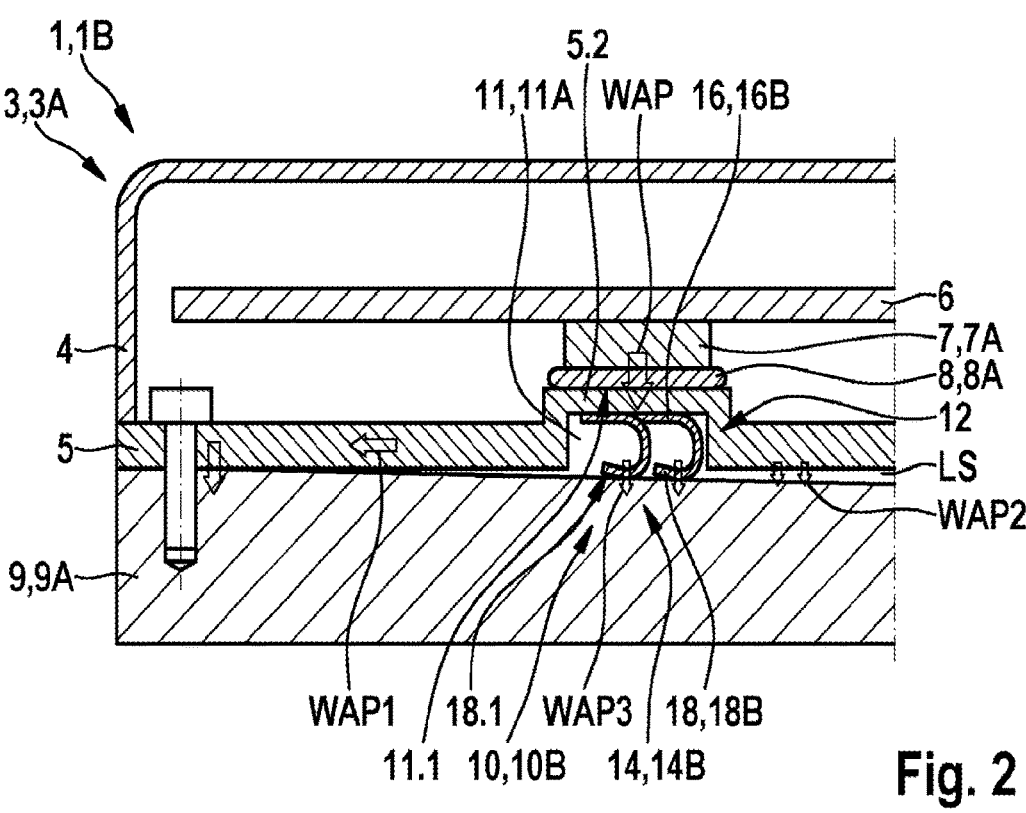
FIG. 2 shows a schematic sectional view of a section of a second exemplary embodiment of a controller assembly according to the present invention, in particular in a vehicle, with a second exemplary embodiment of a heat dissipating device according to the present invention.
Figure 3:
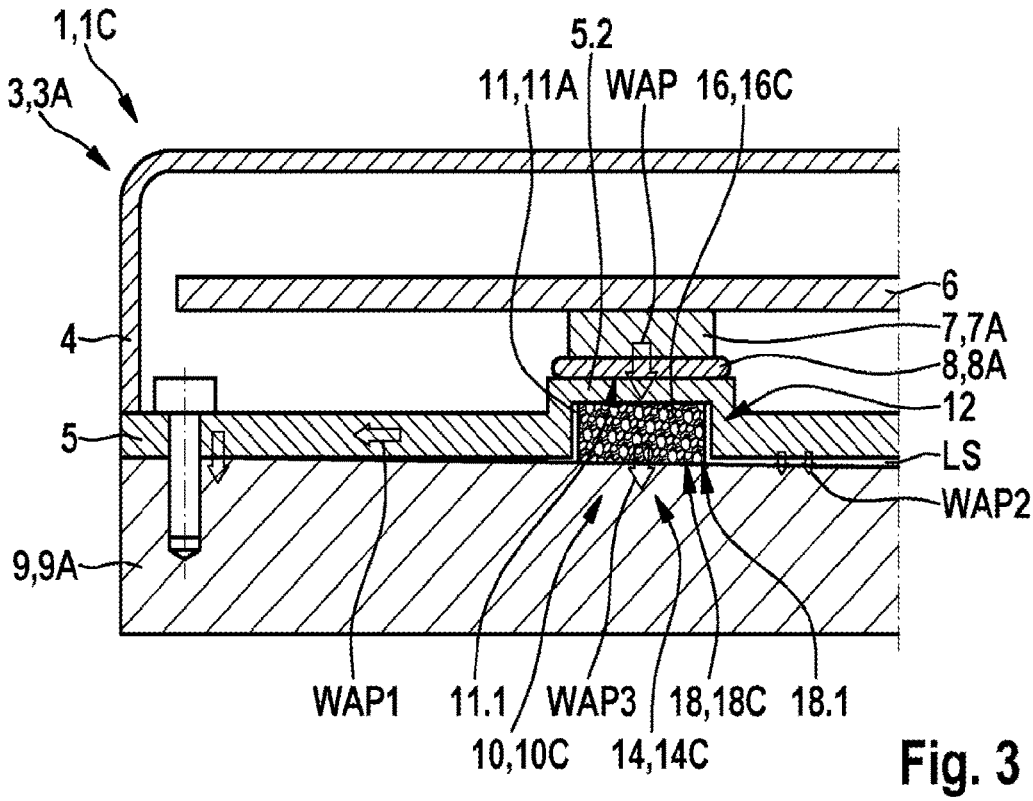
FIG. 3 shows a schematic sectional view of a section of a third exemplary embodiment of a controller assembly according to the present invention, in particular in a vehicle, with a third exemplary embodiment of a heat dissipating device according to the present invention.
Figure 4:
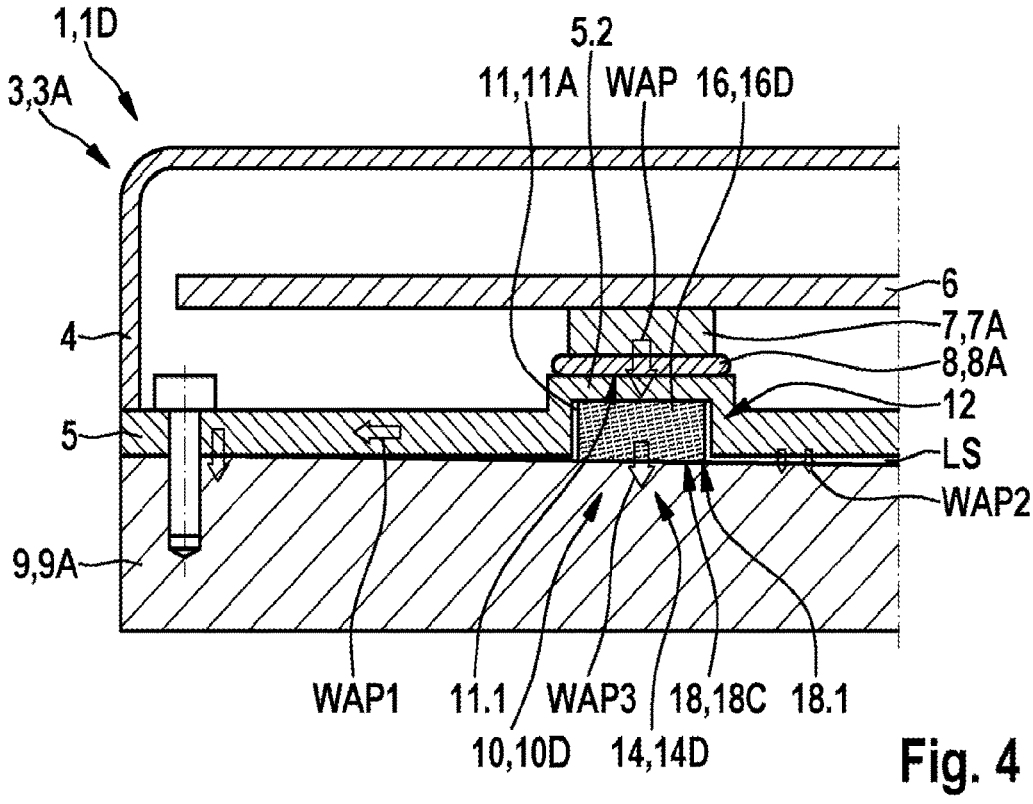
FIG. 4 shows a schematic sectional view of a section of a fourth exemplary embodiment of a controller assembly according to the present invention, in particular in a vehicle, with a fourth exemplary embodiment of a heat dissipating device according to the present invention.

As can be further seen from FIGS. 2 through 4, the at least one mosaic segment 14B, 14C, 14D in the illustrated exemplary embodiments of the controller assembly 1B, 1C, 1D is made of one piece. Here, the heat dissipating devices 10B, 10C, 10D shown in FIGS. 2 through 4 each have only a single mosaic segment 14B, 14C, 14D.

As can be further seen from FIG. 2, the mosaic segment 14B shown comprises a plurality of spring elements 16B that form the thermally conductive and elastic compensation element 16. Here, flattened spring ends 18B of the two spring elements 16B form the thermally conductive low-adherent contact region 18.

As can be further seen from FIG. 3, the mosaic segment 14C shown is configured as a compressible elastic metal foam part 16C, which forms the thermally conductive and elastic compensation element 16. Here, a contact surface 18C of the metal foam part 16C facing away from the base 11 of the receiving area 11 forms the thermally conductive low-adherent contact region 18.

As can be further seen from FIG. 4, the mosaic segment 14D shown is configured as a compressible elastic metal wool member 16D, which forms the thermally conductive and elastic compensation element 16. Here, a contact surface 18C of the metal wool part 16D facing away from the base 11.1 of the receiving area 11 forms the thermally conductive contact region 18.

In an alternative exemplary embodiment of the heat dissipating device 10 not shown, the at least one mosaic segment 14 is configured as a fin structure comprising a plurality of fins projecting from a base plate, which form thermally conductive and elastic compensation element 16. Here, the base plate rests against the inner surface of the base 11 of the receiving area 11 and is preferably bonded to the base 11.1 of the receiving area 11 via a thermally conductive adhesive bond. The edges of the fins facing away from the base plate form the thermally conductive low-adherent contact region 18. In another alternative exemplary embodiment of the heat dissipating device 10, which is not shown, the at least one mosaic segment 14 is configured as a metal foil with nubs comprising a plurality of nubs protruding from a base surface, which form the thermally conductive and elastic compensation element 16. In this case, the base surface of the metal foil with nubs rests against the inner surface of the base 11.1 of the receiving area 11 and is preferably bonded to the base 11.1 of the receiving area 11 via a thermally conductive adhesive bond. The nubs facing away from the base plate form the thermally conductive low-adherent contact region 18.

Figure 5:
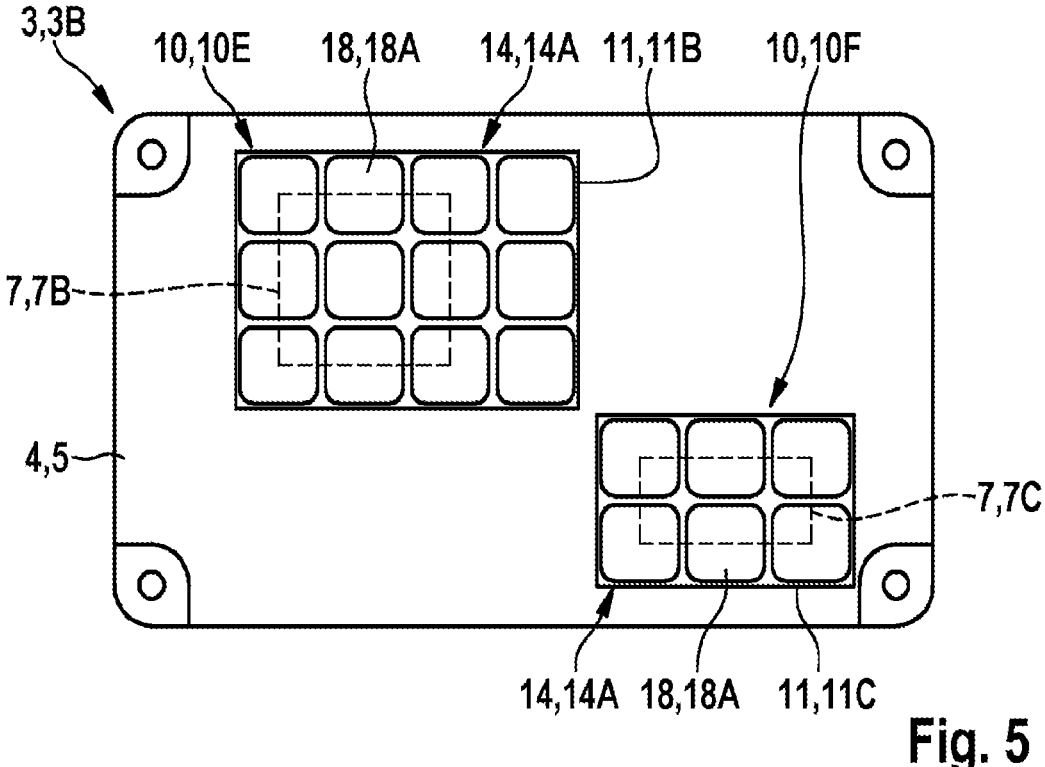
FIG. 5 shows a schematic diagram of a base of a housing of a controller for a controller assembly according to the present invention.

As can be further seen from FIG. 5, in the illustrated exemplary embodiment, two heat dissipating devices 10E, 10F are partially arranged on the base 5 of the controller 3B. Here, a first heat dissipating device 10E comprises twelve mosaic segments 14A arranged in a first receiving area 11B and used to dissipate heat generated by a first electrical assembly 7B. A second heat dissipating device 10F comprises six mosaic segments 14A, which are arranged in a second receiving area 11C and are used to dissipate heat generated by a second electrical assembly 7C.

In an exemplary embodiment not shown, the heat dissipating device 10 is configured as a large area with a plurality of mosaic segments 14. Here, the mosaic segments 14 are distributed over the entire base 5 of the controller 3, so that the controller 3 is thermally connected to the cooling device 9A over a large area for heat dissipation.

The invention claimed is:

1. A heat dissipating device for a controller assembly in a vehicle, the device comprising:
   a receiving area open on at least one side; and
   at least one mosaic segment which is arranged in the receiving area and includes a thermally conductive and elastic compensation element and a thermally conductive low-adherent contact region, wherein the at least one mosaic segment is arranged in the receiving area such that the thermally conductive and elastic compensation element of the at least one mosaic segment rests against an inner surface of a base of the receiving area and at least the thermally conductive low-adherent contact region of the at least one mosaic segment partly protrudes out of the receiving area at an open face of the receiving area which is opposite the base, wherein an outer surface of the base of the receiving area forms a rigid first contact surface for a heat source or for a heat sink, and the thermally conductive low-adherent contact region of the at least one mosaic segment forms a flexible second contact surface for the heat sink or the heat source.

2. The heat dissipating device according to claim 1, wherein the at least one mosaic segment is non-detachably connected to the inner surface of the receiving area.

3. The heat dissipating device according to claim 1, wherein the at least one mosaic segment is made of multiple pieces.

4. The heat dissipating device according to claim 3, wherein the thermally conductive and elastic compensation element of the at least one mosaic segment is a gap filler and the thermally conductive low-adherent contact region of the at least one mosaic segment is configured as a metal platelet which is bonded to the gap filler.

5. The heat dissipating device according to claim 1, wherein the at least one mosaic segment is made of one piece.

6. The heat dissipating device according to claim 5, wherein the at least one mosaic segment includes at least one spring member forming the thermally conductive and elastic compensation element, wherein a spring end of the at least one spring member forms the thermally conductive low-adherent contact region.

7. The heat dissipating device according to claim 5, wherein the at least one mosaic segment is configured as a metal foam part which forms the thermally conductive and elastic compensation element, wherein a bearing surface of the metal foam part facing away from the base of the receiving area forms the thermally conductive low-adherent contact region.

8. The heat dissipating device according to claim 5, wherein the at least one mosaic segment is configured as a metal wool part which forms the thermally conductive and elastic compensation element, wherein a bearing surface of the metal wool part facing away from the base of the receiving area forms the thermally conductive low-adherent contact region.

9. The heat dissipating device according to claim 5, wherein the at least one mosaic segment is configured as a fin structure including a plurality of fins projecting from a base plate and forming the thermally conductive and elastic compensation element, wherein the base plate rests against the inner surface of the base of the receiving area and edges of the fins facing away from the base plate form the thermally conductive low-adherent contact region.

10. The heat dissipating device according to claim 5, wherein the at least one mosaic segment is configured as a metal foil with nubs including a plurality of nubs projecting from a base surface forming the thermally conductive and elastic compensation element, wherein the base surface of said metal foil with nubs rests against the inner surface of the base of the receiving area and the nubs facing away from the base plate form the thermally conductive low-adherent contact region.

11. A controller assembly for a vehicle, comprising:
a controller which includes a housing, and at least one heat source arranged inside the housing; and
a heat sink configured as a cooling device, the controller being detachably connected to the cooling device, the at least one heat source being thermally coupled to the housing of the controller via a first thermal interface, at least one heat dissipating device being arranged between the controller and the cooling device which forms a second thermal interface between the housing and the cooling device, and dissipates heat generated by the at least one heat source to the cooling device;

wherein the at least one heat dissipating device including:
a receiving area open on at least one side, and
at least one mosaic segment which is arranged in the receiving area and includes a thermally conductive and elastic compensation element and a thermally conductive low-adherent contact region, wherein the at least one mosaic segment is arranged in the receiving area such that the thermally conductive and elastic compensation element of the at least one mosaic segment rests against an inner surface of a base of the receiving area and at least the thermally conductive low-adherent contact region of the at least one mosaic segment partly protrudes out of the receiving area at an open face of the receiving area which is opposite the base, wherein an outer surface of the base of the receiving area forms a rigid first contact surface for the heat source, and the thermally conductive low-adherent contact region of the at least one mosaic segment forms a flexible second contact surface for the heat source,
wherein a direct heat dissipation of heat generated by the at least one heat source via the first thermal interface, via the housing of the controller, and via the at least one mosaic segment forming the second thermal interface into the cooling device takes place.

12. The controller assembly according to claim 11, wherein the at least one heat dissipating device has a plurality of mosaic segments and is formed over a large area on the housing of the controller or on the cooling device.

13. The controller assembly according to claim 11, wherein a plurality of the heat dissipating devices are formed partially distributed on the housing of the controller or on the cooling device.

14. The controller assembly according to claim 11, wherein the receiving area of the at least one heat dissipating device is formed in a depression in a region of the first thermal interface of the housing of the controller.

15. The controller assembly according to claim 11, wherein the receiving area of the at least one heat dissipating device is formed in a depression in a surface of the cooling device facing the controller, the cooling device being arranged in an assembled state of the controller assembly in a region of the first thermal interface on the housing of the controller.

\* \* \* \* \*